United States Patent
Tao et al.

(10) Patent No.: US 7,629,597 B2
(45) Date of Patent: Dec. 8, 2009

(54) DEPOSITION REDUCTION SYSTEM FOR AN ION IMPLANTER

(75) Inventors: Teng-Chao Tao, Saugus, MA (US); Philip J Ring, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 517 days.

(21) Appl. No.: 11/506,998

(22) Filed: Aug. 18, 2006

(65) Prior Publication Data

US 2008/0073576 A1    Mar. 27, 2008

(51) Int. Cl.
*G21K 5/10* (2006.01)

(52) U.S. Cl. .............. 250/492.21; 250/492.1; 250/492.2

(58) Field of Classification Search .... 250/492.1–492.3
See application file for complete search history.

(56) References Cited

U.S. PATENT DOCUMENTS

| | | | | |
|---|---|---|---|---|
| 4,717,829 A | * | 1/1988 | Turner | 250/492.2 |
| 5,146,098 A | * | 9/1992 | Stack | 250/492.2 |
| 5,378,899 A | * | 1/1995 | Kimber | 250/492.21 |
| 5,436,790 A | | 7/1995 | Blake et al. | |
| 5,444,597 A | | 8/1995 | Blake et al. | |
| 5,856,674 A | * | 1/1999 | Kellerman | 250/423 F |
| 5,909,031 A | * | 6/1999 | Kellerman et al. | 250/492.21 |
| 6,194,734 B1 | * | 2/2001 | Loomis et al. | 250/492.21 |
| 6,207,964 B1 | * | 3/2001 | McIntyre et al. | 250/492.21 |
| 6,291,828 B1 | * | 9/2001 | Saadatmand et al. | 250/492.21 |
| 6,580,082 B1 | * | 6/2003 | Mitchell | 250/492.2 |
| 6,583,428 B1 | * | 6/2003 | Chipman et al. | 250/492.21 |
| 6,992,309 B1 | | 1/2006 | Petry et al. | |
| 6,992,311 B1 | * | 1/2006 | Ring et al. | 250/492.21 |
| 7,199,383 B2 | * | 4/2007 | Chen et al. | 250/492.21 |
| 7,394,073 B2 | * | 7/2008 | Cummings et al. | 250/397 |

* cited by examiner

*Primary Examiner*—David A Vanore
*Assistant Examiner*—Andrew Smyth
(74) *Attorney, Agent, or Firm*—Tarolli, Sundheim, Covell & Tummino LLP

(57) ABSTRACT

A system for controlling the temperature of a semiconductor workpiece processing tool and surrounding structure, thereby reducing the deposition rates within an ion implanter. A faraday flag structure comprising a conductive strike plate coupled to a circuit for monitoring ions striking the strike plate to obtain an indication of the and a base supporting the strike plate that includes a thermally conductive material surrounding at least a portion of an outer perimeter of the strike plate. The faraday flag structure base defines a conduit for routing coolant through the thermally conductive material surrounding the strike plate. Positioned below the faraday flag is a thermally controlled cold trap that receives and retains foreign material appearing in ion implanter.

18 Claims, 4 Drawing Sheets

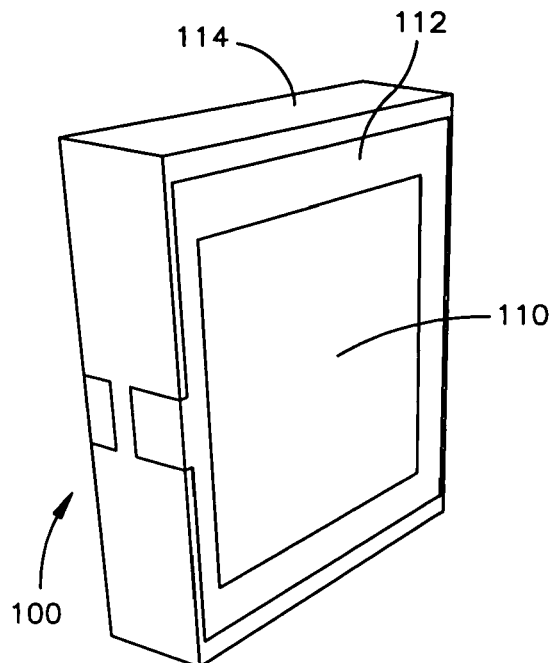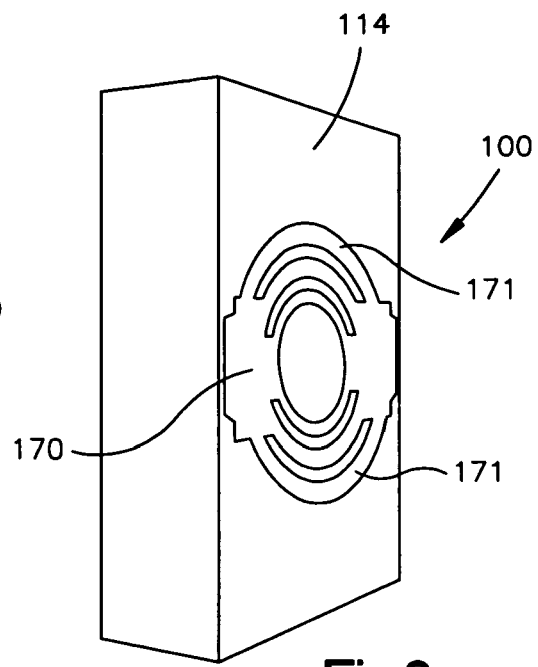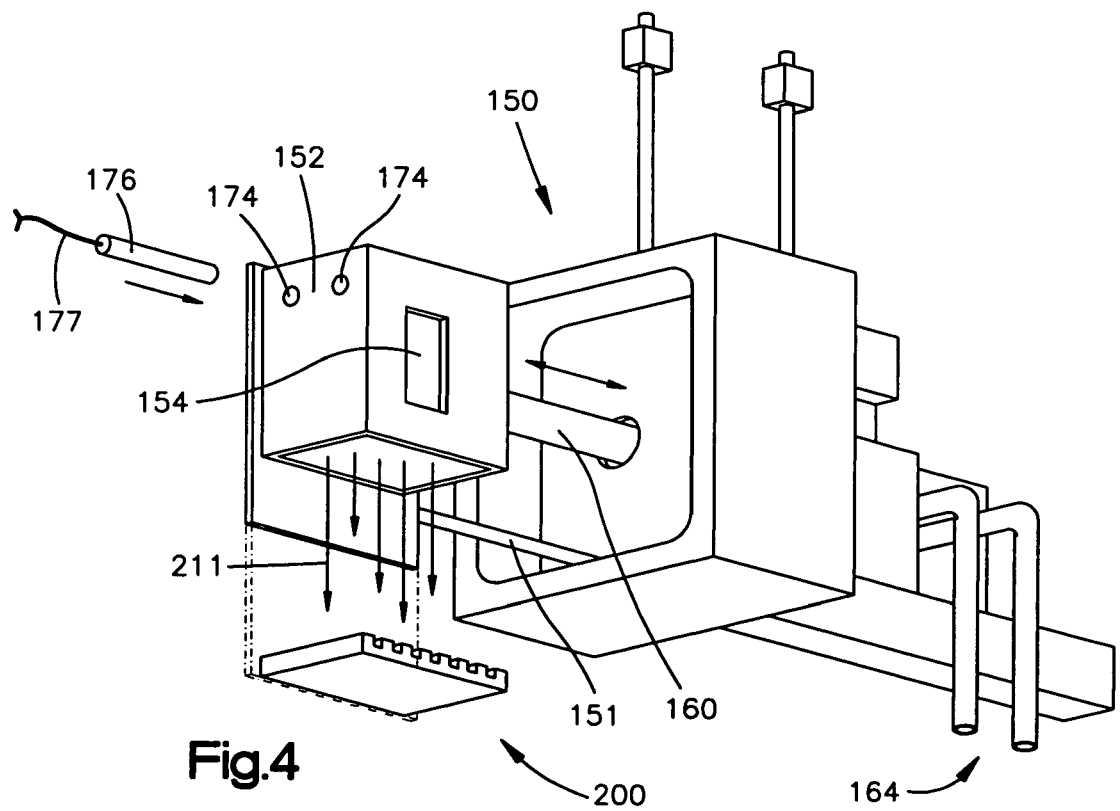

DEPOSITION REDUCTION SYSTEM FOR AN ION IMPLANTER

FIELD OF THE INVENTION

The present invention relates to an improved system for use with an ion implanter that reduces deposition rates of materials and hence extends the maintenance schedule. Less flaking of materials do to build up between maintenance schedules is also achieved.

BACKGROUND ART

Ion implanters can be used to treat silicon wafers by bombardment of the wafers with an ion beam. One use of such beam treatment is to selectively dope the wafers with impurities of a controlled concentration to yield a semiconductor material during fabrication of a integrated circuits.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes that energize and direct the flow of ions from the source. The desired ions are separated from byproducts of the ion source in a mass analysis device, typically a magnetic dipole performing mass dispersion of the extracted ion beam. The beam transport device, typically a vacuum system containing an optical train of focusing devices transports the ion beam to the wafer processing device while maintaining desired optical properties of the ion beam. Finally, semiconductor wafers are implanted in the wafer processing device.

Batch processing ion implanters include a spinning disk support for moving multiple silicon wafers through the ion beam. The ion beam impacts the wafer surface as the support rotates the wafers through the ion beam.

Serial implanters treat one wafer at a time. The wafers are supported in a cassette and are withdrawn one at time and placed on a support. The wafer is then oriented in an implantation orientation so that the ion beam strikes the single wafer. These serial implanters use beam shaping electronics to deflect the beam from its initial trajectory and often are used in conjunction with coordinated wafer support movements to selectively dope or treat the entire wafer surface.

Faraday flags are used to measure beam current. These flags are periodically inserted into an ion beam either upstream of the implantation chamber or at a region behind a workpiece support to monitor beam current. U.S. Pat. No. 6,992,309 to Petry et al. illustrates a dosimetry system having a faraday flag that is mounted for movement along a controlled path. The disclosure of the '309 patent is incorporated herein by reference.

SUMMARY

The disclosed system is based on studies done relating to material deposition on the apparatus of the faraday flag and surrounding structure, which was found to be a function of temperature. Studies concerning steady state beam power as a function of implanter component temperature have shown a relation between deposition rate of impurities in the region of the faraday flag and component temperature. These studies show that the deposition rate is reduced (at a quadratic rate) as component (substrate) temperature increases. These studies predict a ninety percent decrease in the deposition rate as the temperature increases from 20 degrees C. to 270 degrees C.

It has been observed that flag faraday graphite target temperatures can reach over 1000 degrees Celsius when subjected to a high power beam flux. This temperature increase is due to an inability for heat to dissipate away from the faraday flag. Prior art flag targets rely on radiation for heat dissipation. Heat loses through conduction and convection are limited due to the flags position in a highly evacuated region of the implanter. There is a need to remove heat resulting with a high beam flux impinging on the graphite target and thereby control component temperatures in the implanter. Further, there is a need to reduce sputter material resulting from ion bombardment on the faraday flag assembly.

One exemplary system includes a source, beam transfer structure and a workpiece support defining a path of travel for ions that impinge on one or more workpieces at an implantation station. A faraday flag structure has a conductive strike plate coupled to a circuit for monitoring ions striking the strike plate to obtain an indication of the ion beam current. A base supports the strike plate and includes a thermally conductive material surrounding at least a portion of an outer perimeter of the strike plate to conduct heat energy away from the strike plate. Located below the strike plate is a cold trap, which is a thermally regulated structure. The cold trap is designed to attract sputterred material and reduce film buildup within the ion implanter, thus improving the quality of the finished product and reducing cleaning and maintenance schedules within the ion implantation system.

Further features of the disclosure will become apparent to those skilled in the art to which the present invention relates from reading the following specification with reference to the accompanying drawings.

BRIEF DESCRIPTION OF THE DRAWINGS

FIGS. 2 and 3 are schematic depictions of a faraday flag strike plate and structure supporting the strike plate;

FIG. 4 is a perspective view of a deposition reduction system that includes a cold trap and faraday flag system for inserting the strike plate into an ion beam;

EXEMPLARY EMBODIMENT FOR PRACTICING THE INVENTION

Figure 1:
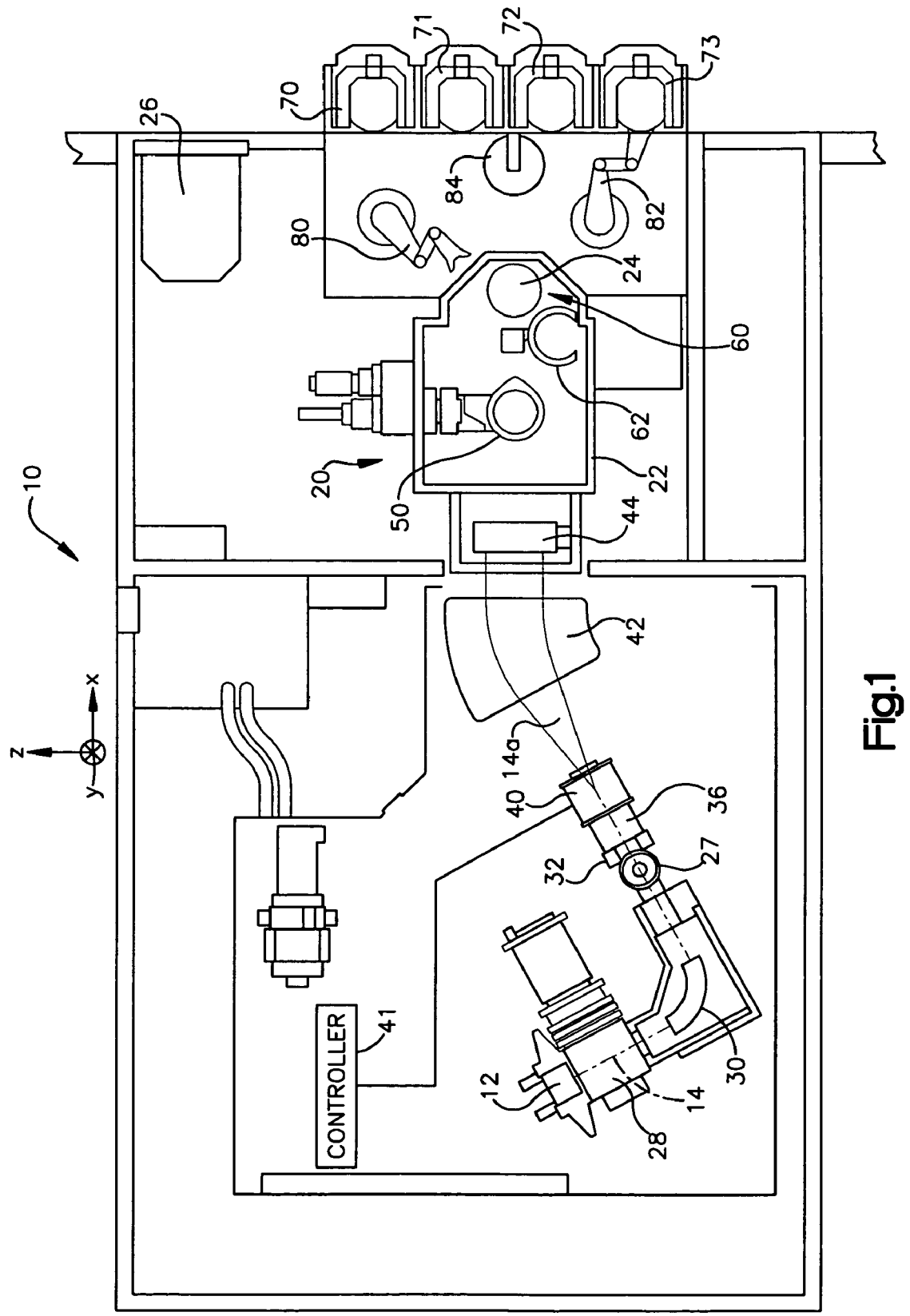
FIG. 1 is schematic view of an ion implanter for ion beam treatment of a workpiece such as a silicon wafer mounted on a support.

Turning to the drawings, FIG. 1 illustrates a schematic depiction of an ion beam implanter 10. The implanter includes an ion source 12 for creating ions that form an ion beam 14 which is shaped and selectively deflected to traverse a beam path to an end or implantation station 20. The implantation station includes a vacuum or implantation chamber 22 defining an interior region in which a workpiece 24 such as a semiconductor wafer is positioned for implantation by ions that make up the ion beam 14. Control electronics indicated schematically as a controller 41 are provided for monitoring and controlling the ion dosage received by the workpiece 24. Operator input to the control electronics are performed via a user control console 26 located near the end station 20. The ions in the ion beam 14 tend to diverge as the beam traverses a region between the source and the implantation chamber. To reduce this divergence, the region is maintained at low pressure by one or more vacuum pumps 27.

The ion source 12 includes a plasma chamber defining an interior region into which source materials are injected. The source materials may include an ionizable gas or vaporized source material. Ions generated within the plasma chamber are extracted from the chamber by ion beam extraction assembly 28, which includes a number of metallic electrodes for creating an ion accelerating electric field.

Positioned along the beam path 14 is an analyzing magnet 30 which bends the ion beam 14 and directs it through a beam shutter 32. Subsequent to the beam shutter 32, the beam 14 passes through a quadrupole lens system 36 that focuses the beam 14. The beam then passes through a deflection magnet 40, which is controlled by the controller 41. The controller 41 provides an alternating current signal to the conductive windings of the magnet 40 which in turn caused the ion beam 14 to repetitively deflect or scan from side to side at a frequency of several hundred Hertz. In one disclosed embodiment, scanning frequencies of 200 to 300 Hertz are used. This deflection or side to side scanning generates a thin, fan shaped ribbon ion beam 14a.

Ions within the fan shaped ribbon beam follow diverging paths after they leave the magnet 40. The ions enter a parallelizing magnet 42 wherein the ions that make up the beam 14a are again bent by varying amounts so that they exit the parallelizing magnet 42 moving along generally parallel beam paths. The ions then enter an energy filter 44 that deflects the ions downward (y-direction in FIG. 1) due to their charge. This removes neutral particles that have entered the beam during the upstream beam shaping that takes place.

The ribbon ion beam 14a that exits the parallelizing magnet 42 is an ion beam with a cross-section essentially forming a very narrow rectangle that is, a beam that extends in one direction, e.g., has a vertical extent that is limited (e.g. approx ½ inch) and has an extent in the orthogonal direction that widens outwardly due to the scanning or deflecting caused to the magnet 40 to completely cover a diameter of a workpiece such as a silicon wafer.

Generally, the extent of the ribbon ion beam 14a is sufficient to, when scanned, implant an entire surface of the workpiece 24. Assume the workpiece 24 has a horizontal dimension of 300 mm. (or a diameter of 300 mm.). The magnet 40 will deflect the beam such that a horizontal extent of the ribbon ion beam 14a, upon striking the implantation surface of the workpiece 24 within the implantation chamber 22, will be at least 300 mm.

A workpiece support structure 50 both supports and moves the workpiece 24 (up and down in the y direction) with respect to the ribbon ion beam 14 during implantation such that an entire implantation surface of the workpiece 24 is uniformly implanted with ions. Since the implantation chamber interior region is evacuated, workpieces must enter and exit the chamber through a load lock 60. A robot 62 positioned within the implantation chamber 22 moves wafer workpieces to and from the load lock 60. A workpiece 24 is schematically shown in a horizontal position within the load lock 60 in FIG. 1. The robot 62 moves the workpiece 24 from the load lock 60 to the support 50 by means of an arm which reaches into the load lock 60 to capture a workpiece for movement within the evacuated region of the implantation chamber. Prior to implantation, the workpiece support structure 50 rotates the workpiece 24 to a vertical or near vertical position for implantation. If the workpiece 24 is vertical, that is, normal with respect to the ion beam 14, the implantation angle or angle of incidence between the ion beam and the normal to the workpiece surface is 0 degrees.

In a typical implantation operation, undoped workpieces (typically semiconductor wafers) are retrieved from one of a number of cassettes 70-73 by one of two robots 80, 82 which move a workpiece 24 to an orienter 84, where the workpiece 24 is rotated to a particular orientation. A robot arm retrieves the oriented workpiece 24 and moves it into the load lock 60. The load lock closes and is pumped down to a desired vacuum, and then opens into the implantation chamber 22. The robotic arm 62 grasps the workpiece 24, brings it within the implantation chamber 22 and places it on an electrostatic clamp or chuck of the workpiece support structure 50. The electrostatic clamp is energized to hold the workpiece 24 in place during implantation. Suitable electrostatic clamps are disclosed in U.S. Pat. Nos. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

After ion beam processing of the workpiece 24, the workpiece support structure 50 returns the workpiece 24 to a horizontal position and the electrostatic clamp is de-energized to release the workpiece. The arm 62 grasps the workpiece 24 after such ion beam treatment and moves it from the support 50 back into the load lock 60. In accordance with an alternate design the load lock has a top and a bottom region that are independently evacuated and pressurized and in this alternate embodiment a second robotic arm (not shown) at the implantation station 20 grasps the implanted workpiece 24 and moves it from the implantation chamber 22 back to the load lock 60. From the load lock 60, a robotic arm of one of the robots moves the implanted workpiece 24 back to one of the cassettes 70-73 and most typically to the cassette from which it was initially withdrawn.

Faraday Flag

A faraday flag 100 built in accordance with an exemplary embodiment has a graphite target or strike plate 110 mounted to a cup 112 which is a thermal control jacket described below that can be cooled or heated as appropriate. The thermal jacket is made from aluminum, a thermally conductive material that provides an efficient way for the heat to move into or out of the target or strike plate 110. The jacket is designed to accept different shape faraday flags.

The principle of operation of the cooling jacket is as follows.

A target of any shape is inserted into an appropriately dimensioned cup with a minimum clearance around the target. The cup is designed to maximize heat flow away from the target and is maintained at room temperature. A gasket may be designed into the structure depending on a compressibility and thermal conductivity requirement. When the target is heated it will expand, and will apply uniform pressure to a gasket between the target and the cup which will cause the gasket to deform thus improving thermal contact at the interface and reduce and control target temperature.

The thermal jacket or cup utilizes conductive heating and/or cooling as a principle mechanism for heat transfer in a vacuum system. A mismatch in thermal expansion coefficients between the thermal jacket and the target material controls the contact pressure thus providing the ability to passively or actively control the target temperature. There are a number of ways to improve the interface conductivity either individually or in combination with one another. The thermal jacket may use thermal expansion to an applied load at the thermal interface and cause interface deformation and increase conductive heat transfer area. The thermal jacket may be designed with a preload at the thermal interface causing interface deformation and increase the conductive heat transfer area. The thermal jacket may be designed with a high vacuum compatible "thermal paste" to improve thermal conductivity between the strike plate and thermal jacket.

Initial estimates based on the design illustrated in FIGS. 2 and 3 show that the graphite target temperature will peak at 405 k with 2000 watts of power input to the target. This assumes a perfect contact at the gasket interface. In contrast to the above illustration, where the cooling is absent, the target temperature can reach 1400 k with 2000 watts of power input to the target.

A thermally controlled ion strike plate can be integrated into the ion implanter by incorporating the invention into the flag faraday assembly 150 of FIG. 4. This assembly 150 is for use with an ion source, beam transfer structure and a workpiece support defining a path of travel such as show in FIG. 1. In one embodiment (described below) there is a cold trap 200 utilized and in an alternate embodiment there is no cold trap.

The faraday flag assembly 150 includes as a subcomponent the conductive strike plate coupled to a circuit (not shown) by a cable 151 that sends signals to the controller 41 for monitoring ions striking the strike plate to obtain an indication of the beam current. A base 114 supports the strike plate within a housing 152 which defines an entryway or channel 154 which allows ions in the beam to enter a housing interior and impact the strike plate. An elongated support 160 coupled to the housing 152 moves the strike plate in an out of a beam path of travel 162. Coolant supply and return lines 164 are routed through the support 160. The base 114 includes a cutout 170 that defines a coolant path 171 that includes coolant channels into which coolant is routed to maintain a temperature of the strike plate by dissipating heat away from said strike plate.

Figure 5:
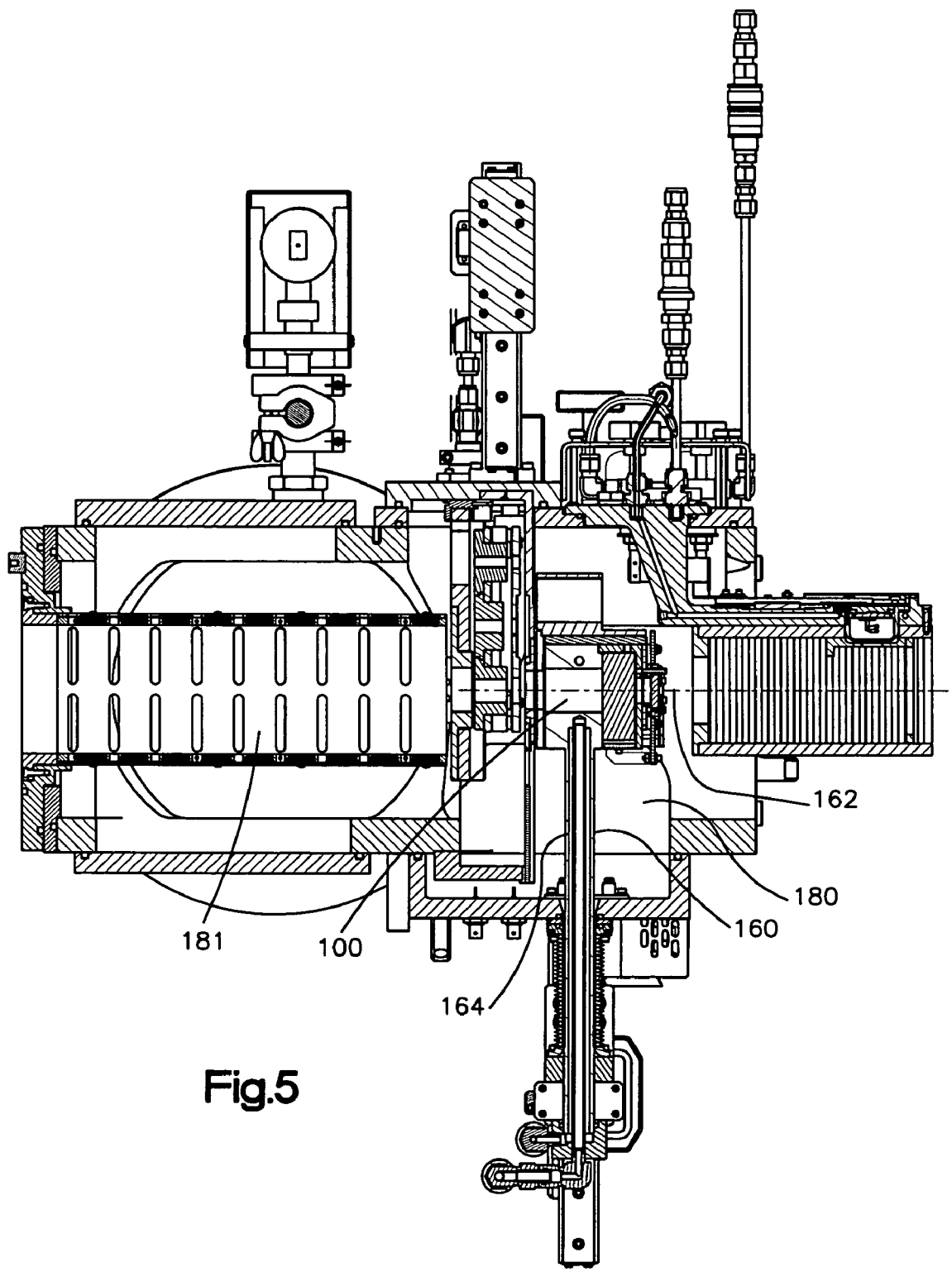
FIG. 5 is a section view of a portion of an ion implanter.

In operation, during ion implantation of a workpiece 24 the faraday flag 100 is retracted from within the ion beam so that the ions in the beam 24 pass unimpeded through the region of the faraday flag 100 shown in FIG. 5 immediately downstream from a beam accelerator 181 to the implantation chamber 20. A motor (not shown) is actuated by the controller 41 to move the faraday flag 100 into the beam path from a region 180 it occupies during implantation. During the time the ions strike the strike plate 110 the coolant flows into and out of the faraday assembly 150 through the coolant supply and return lines 164 and through the coolant path 170 located in the base support 114 of the faraday flag 100. The temperature is regulated by, for example thermal couples that monitor the temperature and provide feedback for regulating the cooling supply 164.

Cold Trap

During beam tuning material will sputter from the graphite target 110 due to ion bombardment on the faraday flag assembly. While the heat dissipation system in the faraday flag assembly discussed above significantly reduces the material deposition rate, film buildup in the surroundings is further minimized by the introduction of a cold trap 200 shown in FIGS. 4 and 6. The addition of the cold trap 200 within the implantation chamber 22 provides a temperature gradient that reduces the film growth rate inside the chamber and in particular, along the ion beam path of travel 162 in the region of the faraday flag. The cold trap 200 is designed to have a surface with a high film deposition rate relative to other surfaces in the ion implantation system 10. Such design is achieved, as discussed below because of its low surface temperature (regulated to approximately 20 degrees Celsius), and because of its surface configuration which both attracts and retains particles.

Figure 6:
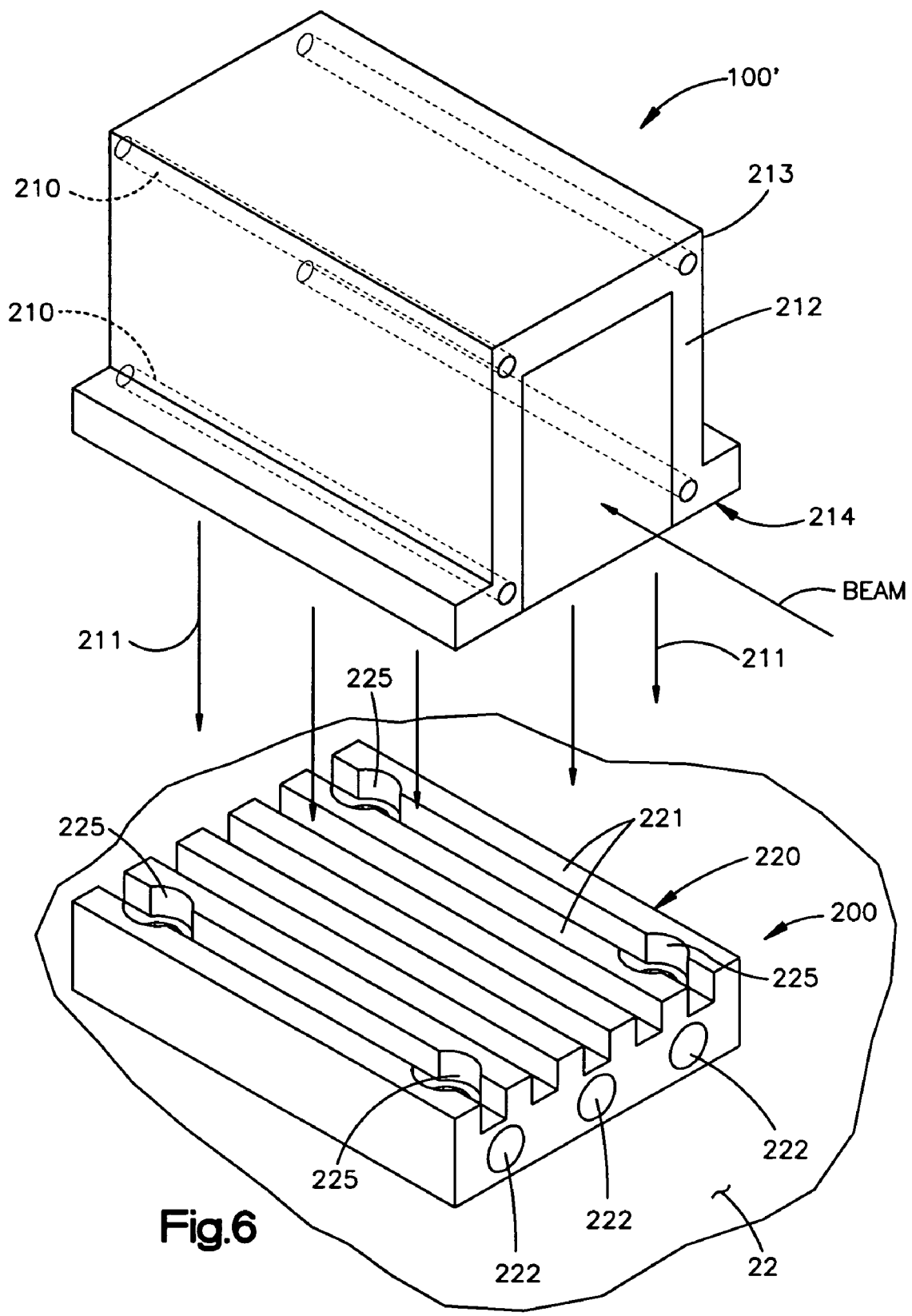
FIG. 6 is a perspective view of a deposition reduction system depicting a separate faraday flag and cold trap embodiment.

A temperature gradient of the system is designed to minimize film growth rate in the beam transport region. Heating cartridges 176 are inserted (typically at the top) into passageways 174 for heating the housing 152. These cartridges are energized by leads 177 controlled by the controller 41 and maintain the temperature of the housing at 300 degrees Celsius. In the embodiment of FIGS. 4 and 6 that utilizes a cold trap 200 cooling of the housing by coolant routed through the support 160 is not used. A preferred heater cartridge is commercially available from Watlow under the tradename Firerod®.

The cold trap 200 shown in FIG. 6 can be composed from several different materials suitable for attracting material deposition and increasing the surface area and/or surface energy, such examples include textured and non-textured aluminum, graphite, porous aluminum, silicon carbide or silicon carbide foam (SiC foam). The cold trap 200 is typically located below a faraday flag assembly 100', somewhat different from the earlier described embodiment with a strike plate at the rear of an open cup 212. The open cup 212 has a high temperature upper region 213 and a relatively cooler lower region 214. The temperature of the open cup 212 is controlled by a closed loop cooling system 210 for regulating the high and low temperature regions, 213 and 214 respectively.

The open cup configuration depicted in FIG. 6 directs the sputter material 211 in a downward direction collecting on the cold trap surface 220. The surface 220 is designed to optimize collecting and retaining sputter material by having a textured surface. In the illustrated embodiment, a crenellating surface is shown having a series of ridges 221. By allowing the film to collect on the trap surface 220, the delamination of film sputter 211 and subsequent depositing on other surfaces within the ion implantation chamber 22 is reduced, allowing implanter maintenance schedules to be extended.

The temperature of the cold trap 200 is regulated by a closed loop temperature controller having a number of coolant supply and return lines 222. While the illustrated embodiment depicts the cold trap 200 positioned below a open cup 212 faraday flag assembly 100' sharing the same length and width, it should be appreciated by those skilled in the art that a cold trap could be any size and positioned at any location within the ion beam implanter 10 without departing from the spirit and scope of the claimed invention. Further, FIG. 6 illustrates the cold trap 200 being fixed to a base of the ion implantation chamber 22 by fasteners 225, but could be coupled to the faraday flag assembly 100 or a device such as the elongated support 160 that would move the cold trap 200 in and out of the beam path of travel 162, providing easy access for maintenance.

It is understood that although an exemplary embodiment of the invention has been described with a degree of particularity, alterations and modifications from that embodiment are included which fall within the spirit or scope of the appended claims.

We claim:

1. For use with a semiconductor processing tool having an evacuated region for treating a workpiece by directing an ion beam to strike a workpiece, apparatus comprising:

a source, beam transfer structure and a workpiece support defining a path of travel for ions that impinge on one or more workpieces at an implantation station, a faraday flag structure comprising:

i) a conductive strike plate coupled to a circuit for monitoring ions striking the strike plate to obtain an indication of the beam current; and ii) a base supporting the strike plate that includes a thermally conductive material surrounding at least a portion of an outer perimeter of the strike plate; and a thermally controlled structure spaced from said faraday flag structure for attracting material dislodged within an evacuated region during implanter operation.

2. The apparatus of claim 1 further comprising a strike plate support coupled to the base for moving the strike plate in and out of the path of travel.

3. The apparatus of claim 2 further comprises a coolant supply line routed through the strike plate support.

4. The apparatus of claim 1 wherein the base includes a coolant path into which coolant is routed to maintain a temperature of the strike plate by dissipating heat away from said strike plate.

5. The apparatus of claim 1 additionally comprising a heater and a controller coupled to the heater for maintaining the base at a controlled first temperature and wherein the thermally controlled structure is maintained at a lower second temperature.

6. The apparatus of claim 2 wherein said thermally controlled structure is coupled to said strike plate support for moving the thermally controlled structure in and out of the path of travel.

7. The apparatus of claim 1, wherein said thermally controlled structure includes a textured surface for attracting and retaining foreign material.

8. The apparatus of claim 6, wherein said thermally controlled structure includes a textured surface for attracting and retaining foreign material.

9. The apparatus of claim 1 wherein said thermally controlled structure includes a crenellating surface.

10. The apparatus of claim 6, wherein said thermally controlled structure includes a crenellating surface.

11. In a semiconductor processing assembly, a method of reducing and controlling contaminates within an ion implanter the assembly comprising:
mounting a workpiece for processing in an evacuated region and causing a beam of ions to impact on the workpiece by accelerating them from a source to a workpiece through an evacuated travel path;
positioning a strikeplate in a path of travel of said beam of ions to gather ion beam current data, and
controlling a temperature of the strike plate to avoid contaminant building up in the region of the strike plate; and
thermally controlling a structure spaced from said strike plate for attracting contaminates in said evacuated region.

12. The method of claim 11 further comprising providing a textured surface on said structure for containing contaminates in said evacuated region.

13. A contaminate reduction structure comprising:
a) a faraday flag assembly comprising:
i) a conductive strike plate coupled to a circuit for monitoring ions striking the strike plate to obtain an indication of an ion beam current; and
ii) a base supporting the strike plate that includes a thermally conductive material surrounding at least a portion of an outer perimeter of the strike plate;
b) a thermally controlled structure spaced from said faraday flag for attracting and retaining contaminates within an evacuated region.

14. The contaminate reduction structure of claim 13 wherein the base defines a conduit for routing coolant through the thermally conductive material surrounding the strike plate.

15. The contaminate reduction structure of claim 13, wherein said faraday flag includes an open cup.

16. The contaminate reduction structure of claim 13, wherein said thermally controlled structure includes a textured surface for receiving contaminates.

17. The contaminate reduction structure of claim 16, wherein said textured surface is a plurality of ridges.

18. The structure of claim 13 additionally comprising a heater in thermal contact with the base and a controller for turning on and off the heater to maintain the temperature of the base at a set point above a lower temperature of the thermally controlled structure.

* * * * *

UNITED STATES PATENT AND TRADEMARK OFFICE
CERTIFICATE OF CORRECTION

PATENT NO. : 7,629,597 B2  Page 1 of 1
APPLICATION NO. : 11/506998
DATED : December 8, 2009
INVENTOR(S) : Tao et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 629 days.

Signed and Sealed this

Second Day of November, 2010

David J. Kappos
*Director of the United States Patent and Trademark Office*